(12) United States Patent
Shiah et al.

(10) Patent No.: US 7,880,517 B2
(45) Date of Patent: Feb. 1, 2011

(54) DELAYED-LOCKED LOOP WITH POWER-SAVING FUNCTION

(75) Inventors: Chun Shiah, Hsinchu (TW); Chun-Peng Wu, Hsinchu County (TW); Hsien-Sheng Huang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 12/253,211

(22) Filed: Oct. 16, 2008

(65) Prior Publication Data

US 2010/0033217 A1 Feb. 11, 2010

(30) Foreign Application Priority Data

Aug. 8, 2008 (TW) .............................. 97130335 A

(51) Int. Cl.
*H03L 7/06* (2006.01)
(52) U.S. Cl. ...................................... 327/158
(58) Field of Classification Search ........................ None
See application file for complete search history.

(56) References Cited

U.S. PATENT DOCUMENTS

| 2007/0132492 A1* | 6/2007 | Chou | 327/158 |
| 2007/0176656 A1* | 8/2007 | Lesso | 327/158 |
| 2008/0122507 A1* | 5/2008 | Fan et al. | 327/158 |
| 2009/0079719 A1* | 3/2009 | Lee | 345/204 |

* cited by examiner

*Primary Examiner*—Lincoln Donovan
*Assistant Examiner*—Khareem E Almo
(74) *Attorney, Agent, or Firm*—Winston Hsu; Scott Margo

(57) ABSTRACT

A DLL with power-saving function includes a VCDL, a voltage control module, a capacitor, and a phase detector. The VCDL generates a delayed clock signal according to the voltage on the capacitor and a reference clock signal. The phase detector detects phase difference between the delayed clock signal and the reference clock signal and accordingly controls the voltage controller. The voltage controller sinks or sources current to the capacitor for adjusting the voltage on the capacitor. Further, the voltage controller can turn off its charge pump according to a turned-off signal and stops sinking or sourcing current for saving power.

10 Claims, 4 Drawing Sheets

DELAYED-LOCKED LOOP WITH POWER-SAVING FUNCTION

BACKGROUND OF THE INVENTION

1. Field of the Invention

The present invention is related to a Delay-Locked Loop (DLL), or more particularly, a DLL with power-saving function.

2. Description of the Prior Art

Please refer to FIG. 1. FIG. 1 is a diagram illustrating the Dynamic Random Access Memory (DRAM) system 100 of the prior art. The DRAM system 100 comprises the DLL 110 and the DRAM 120. The DRAM system 100, according to the DLL 110, controls the DRAM 120 to access the data. DLL 110 generates a delayed clock signal $CLK_D$ by receiving the reference clock signal CLK, delaying the reference clock signal CLK with a fixed phase, and accordingly generating a delayed clock signal $CLK_D$. In other words, the clock signal CLK and delayed clock signal $CLK_D$ have the same frequency, but the phase of the delayed clock signal $CLK_D$ and the clock signal CLK is statically differentiated by the phase $P_D$. The DRAM 120 comprises input ends $I_1$ and $I_2$. The input end $I_1$ is utilized to receive the delayed clock signal $CLK_D$ and the input end $I_2$ is utilized to receive the turn-off signal $S_{CKE}$. When the DRAM 120 does not receive the turn-off signal $S_{CKE}$, the DRAM 120 accesses the data according to the delayed clock signal $CLK_D$. When the DRAM 120 receives the turn-off signal $S_{CKE}$, the DRAM 120 stops receiving the delayed clock signal $CLK_D$ and the data accessing is stopped.

When the DRAM 120 receives the turn-off signal $S_{CKE}$, the DRAM 120 stops receiving the delayed clock signal $CLK_D$ and the data accessing is stopped. In the meanwhile the phase of the delayed clock signal $CLK_D$ of the DLL 110 and the clock signal CLK does not need to be differentiated by the phase $P_D$ precisely. Due to the DLL 110, after rebooting, needs a long time to generate the delayed clock signal $CLK_D$ with the fixed phase difference $P_D$ compared to the clock signal CLK (indicates the delayed clock signal $CLK_D$ is locked to the clock signal CLK) and this wait time is too long and unacceptable for the DRAM 120. Hence, the DLL 110 cannot be turned off completely as the DRAM 120 is turned off after receiving the turn-off signal $S_{CKE}$. The DLL 110 needs to maintain normal operation while the DRAM 120 is turned off from receiving the turn-off signal $S_{CKE}$, which consequently causing electrical power waste and diminish the convenience of the DRAM system 110 of the prior art.

SUMMARY OF THE INVENTION

The present invention provides a Delay-Locked Loop (DLL) with power-saving function. The DLL comprises a Voltage-Controlled Delay Loop (VCDL), and a voltage controlling module coupled to the second input end of the VCDL. The VCDL comprises a first input end for receiving a first clock signal, a second input end for receiving a controlling voltage, and an output end for outputting a second clock signal by delaying the first clock signal according to the controlling voltage. The voltage controlling module comprises a capacitor coupled between the second input end of the VCDL and a ground end for sustaining the controlling voltage, a phase detector for generating a first controlling signal and a second controlling signal according to phase difference between the first clock signal and the second clock signal, and a voltage controller. The voltage controller comprises a first controlling end for receiving the first controlling signal, a second controlling end for receiving the second controlling signal, a third controlling end for receiving a turn-off signal, and an output end coupled to the capacitor for sourcing or sinking a current with a predetermined magnitude to adjust the controlling voltage according to the first controlling signal, the second controlling signal and the turn-off signal.

The present invention further provides a DLL with power-saving function. The DLL comprises a VCDL and a voltage controlling module coupled to the second input end of the VCDL. The VCDL comprises a first input end for receiving a first clock signal, a second input end for receiving a controlling voltage, and an output end for outputting a second clock signal by delaying the first clock signal according to the controlling voltage. The voltage controlling module comprises a capacitor coupled between the second input end of the VCDL and a ground end for sustaining the controlling voltage, a phase detector for generating a first controlling signal and a second controlling signal according to phase difference between the first clock signal and the second clock signal, and a voltage controller. The voltage controller comprises a current controller and a charge pump. The current controller comprises a first controlling end for receiving the first controlling signal, a second controlling end for receiving the second controlling signal, a third controlling end for receiving a turn-off signal, a first output end for outputting a current controlling signal according to the first controlling signal and the second controlling signal, and a second output end for outputting a boot signal. The charge pump comprises a first controlling end coupled to the first output end of the current controller for receiving the current controlling signal, a second controlling end coupled to the second output end of the current controller for receiving the boot signal, and an output end coupled to the capacitor. Wherein when the charge pump receives the boot signal, the charge pump sources or sinks a current with a predetermined magnitude, according to the current controlling signal.

These and other objectives of the present invention will no doubt become obvious to those of ordinary skill in the art after reading the following detailed description of the preferred embodiment that is illustrated in the various figures and drawings.

DETAILED DESCRIPTION

For the purpose of saving power and granting the user with more convenience, the present invention provides a system that reduces the power consumption of the DLL 110, when the DRAM 120 is turned off from receiving the turn-off signal $S_{CKE}$.

Figure 1:
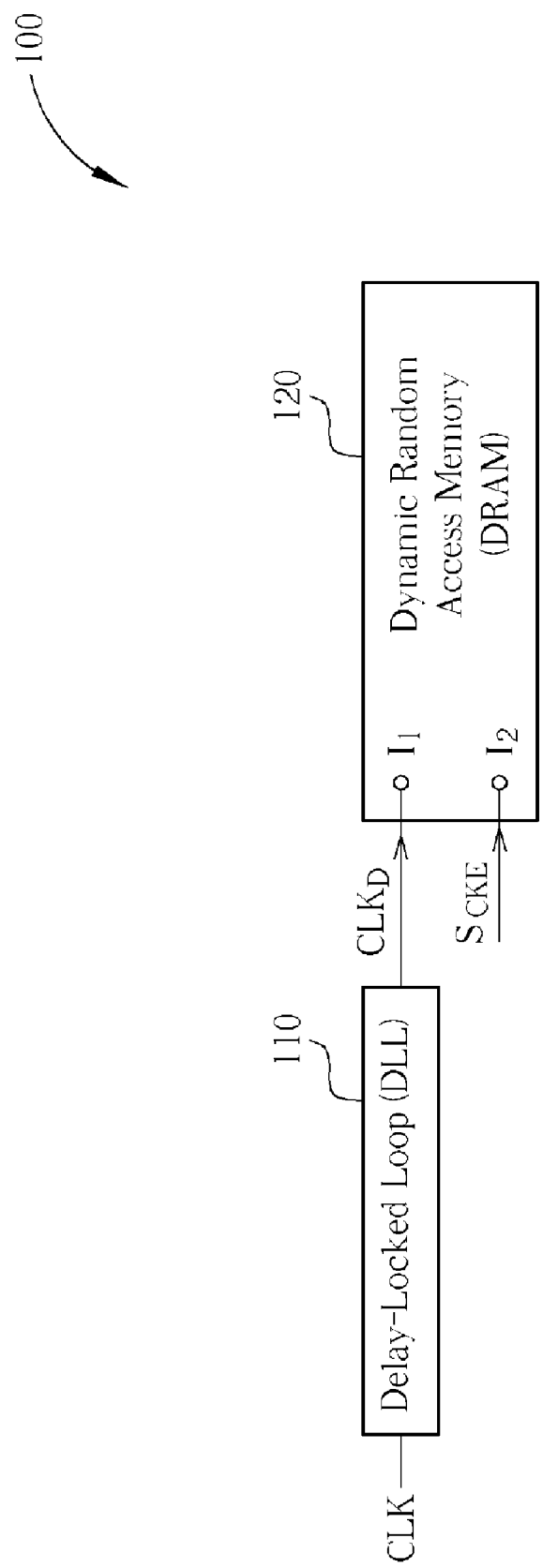
FIG. 1 is a diagram illustrating the Dynamic Random Access Memory (DRAM) system of the prior art.
Figure 2:
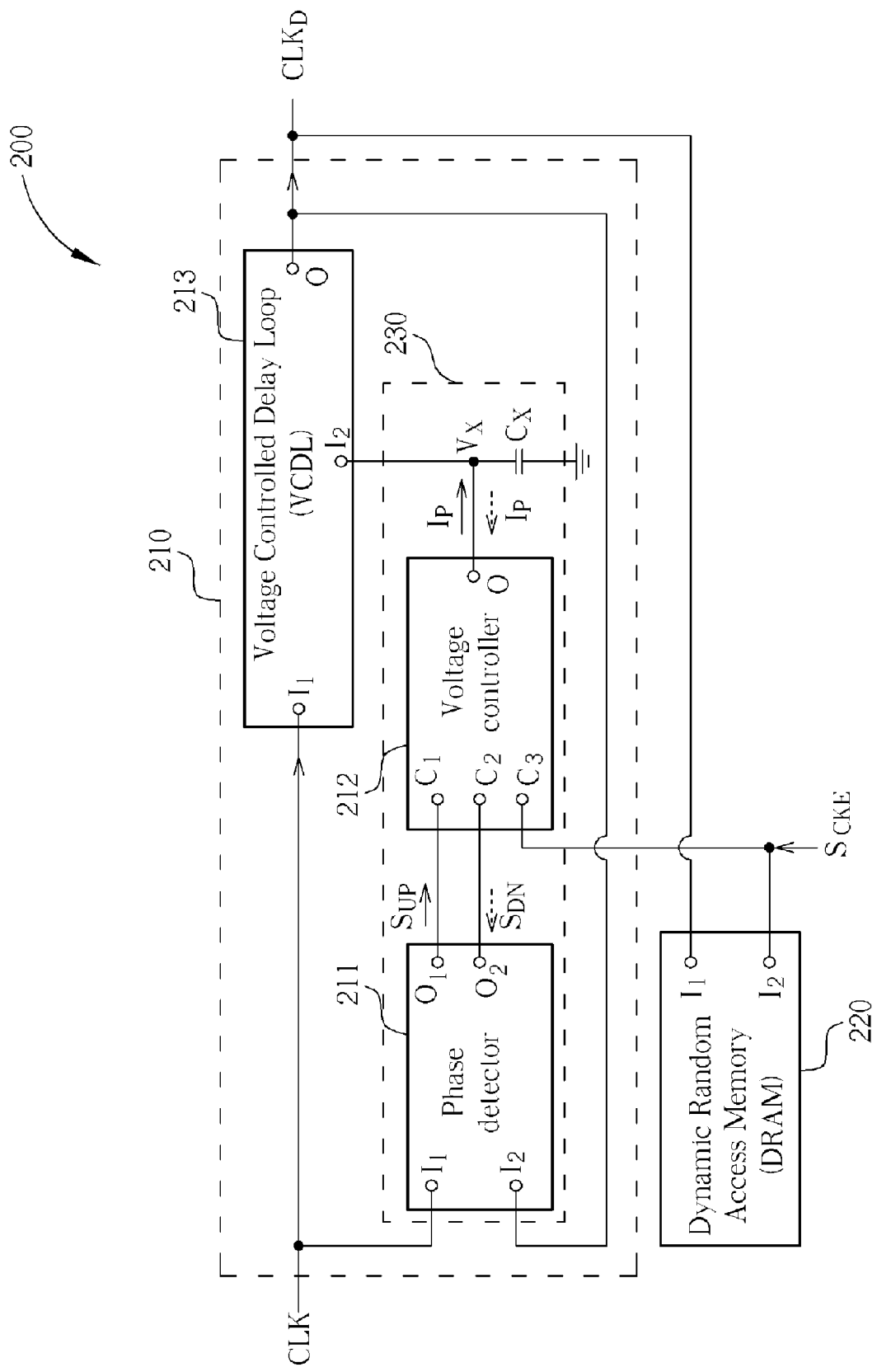
FIG. 2 is a diagram illustrating the DRAM system of the present invention

Please refer to FIG. 2. FIG. 2 is a diagram illustrating the DRAM system 200 of the present invention. As shown in FIG. 2, the DRAM system 200 comprises the DLL 210 and the DRAM 220.

The DRAM 220 comprises two input ends $I_1$ and $I_2$. The input end $I_1$ is utilized to receive the delayed clock signal $CLK_D$ and the input end $I_2$ is utilized to receive the turn-off signal $S_{CKE}$. When the DRAM 220 does not receive the turn-off signal $S_{CKE}$, the DRAM 220 accesses the data according to the delayed clock signal $CLK_D$. When the DRAM 220 receives the turn-off signal $S_{CKE}$, the DRAM 220 stops receiving the delayed clock signal $CLK_D$ and data accessing is stopped.

The DLL 210 comprises the Voltage Controlled Delay Loop (VCDL) 213 and the voltage controlling module 230. The voltage controlling module 230 comprises the phase detector 211, the voltage controller 212 and a capacitor $C_X$. The phase detector 211 comprises two input ends $I_1$ and $I_2$, and an output end O. The voltage controller 212 comprises three control ends $C_1$, $C_2$, and $C_3$, and an output end O. The VCDL comprises two input ends $I_1$ and $I_2$, and an output end O.

The input end $I_1$ of the VCDL 213 is utilized to receive the reference clock signal CLK; the input end $I_2$ is coupled to the capacitor $C_X$; the output end O is utilized to output the delay clock signal $CLK_D$. The clock signal CLK and the delayed clock signal $CLK_D$ have the same frequency, but the phase of the delayed clock signal $CLK_D$ and the clock signal CLK is statically differentiated by a phase $P_D$. The capacitor $C_X$, with a voltage $V_X$, is coupled between the input end $I_2$ of the VCDL 213 and the ground end. The VCDL 213 controls the phase difference $P_D$ between the delayed clock signal $CLK_D$ and the clock signal CLK, according to the voltage $V_X$ of the capacitor $C_X$. For instance, the higher the voltage $V_X$, the larger the phase difference $P_D$. Instead, the lower the voltage $V_X$, the smaller the phase difference $P_D$. The voltage controlling module 230 controls the magnitude of the voltage $V_X$ to adjust the phase difference $P_D$.

The input end $I_1$ of the phase detector 211 is utilized to receive the reference clock signal CLK; the input end $I_2$ is coupled to the output end O of the VCDL 213 to receive the delayed clock signal $CLK_D$; the output end O is coupled to the control end C of the voltage controller 212. The phase detector 211, according to the phase difference between the clock signal CLK and the delayed clock signal $CLK_D$, outputs the control signals $S_{UP}$ or $S_{DN}$ to control the voltage controller 212 to further control the magnitude of the voltage $V_X$. For instance, when the phase of the clock signal CLK is behind that of the delayed clock signal $CLK_D$, the phase detector 211 outputs the control signal $S_{DN}$ to the output end O; when the phase of the clock signal CLK is ahead that of the delayed clock signal $CLK_D$, the phase detector 211 outputs the control signal $S_{UP}$ to the output end O.

The control ends $C_1$ and $C_2$ of the voltage controller 212 are coupled to the output ends $O_1$ and $O_2$ respectively to receive the control signals $S_{UP}$ and $S_{DN}$ outputted from the phase detector 211; the output end O of the voltage controller 212 is coupled between the capacitor $C_X$ and the VCDL 213 to source or sink a current $I_P$ of a predetermined value to control the magnitude of the voltage $V_X$; the control end $C_3$ of the voltage controller 212 is utilized to receive the turn-off signal $S_{CKE}$. The operation principle of the voltage controller 212 is explained as below: when the voltage controller 212 receives the control signal $S_{UP}$, the voltage controller 212 sources the current $I_P$ to the output end O of the voltage controller 212 to increase the voltage $V_X$; instead, when the voltage controller 212 receives the control signal $S_{DN}$, the voltage controller 212 sinks the current $I_P$ to the output end O of the voltage controller 212 to decrease the voltage $V_X$. The magnitude of the current $I_P$ is fixed. Also, when the control end $C_3$ of the voltage controller 212 receives the turn-off signal $S_{CKE}$, the voltage controller 212 does not source/sink the current $I_P$ to/from the capacitor $C_X$. Hence, the voltage controller 212 of the present invention can be turned off when receiving the turn-off signal $S_{CKE}$ to save power, without charging the capacitor $C_X$ continuously. In the meanwhile, as the capacitor $C_X$ is discharged to the ground end, the voltage $V_X$ continues to decline, which causing the phase difference between the clock signal CLK and the delayed clock signal $CLK_D$ to shift away from the fixed phase difference $P_D$. Yet when the voltage controller 212 receives the turn-off signal $S_{CKE}$, the DRAM 220 is also turned off from receiving the turn-off signal $S_{CKE}$ and the consequent phase error is acceptable. In other words, the DRAM system 200 of the present invention can save power consumption by turning off the voltage controller 212 and the DRAM 220 at the same time. The present invention can also increase the capacitance of the capacitor $C_X$ to decrease the decreasing speed of the voltage $V_X$, limiting the error of the delayed clock signal $CLK_D$ when receiving the turn-off signal $S_{CKE}$. Also, turning off the voltage controller 212 does not cause the DLL 210 to require a long period of time for the delayed clock signal $CLK_D$ to be locked to the clock signal CLK. In other words, when the voltage controller 212 is rebooted, the delayed clock signal $CLK_D$ generated from the DLL 210 can be locked to the clock signal CLK in a short period of time.

Figure 3:
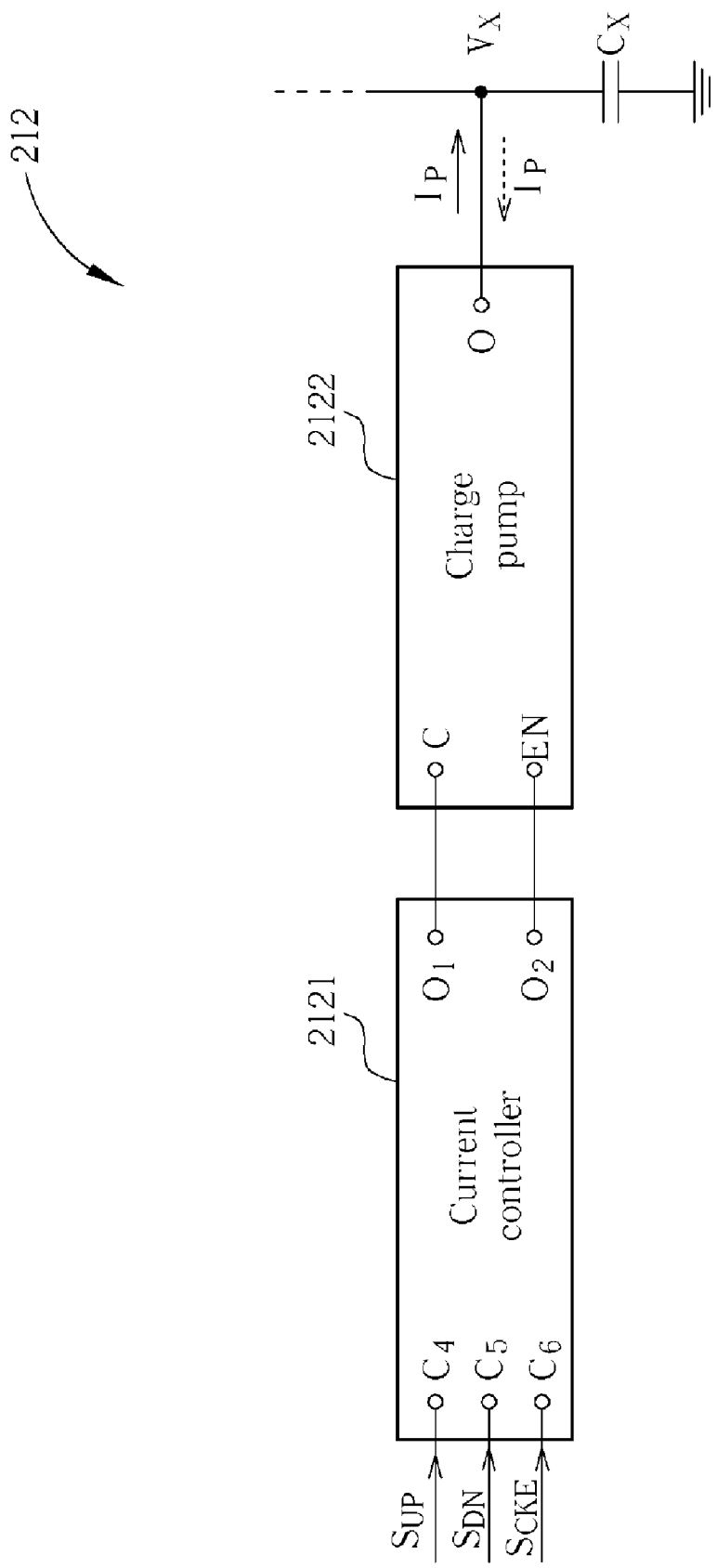
FIG. 3 is a diagram illustrating the voltage controller of the present invention.

Please refer to FIG. 3. FIG. 3 is a diagram illustrating the voltage controller 212 of the present invention. As shown in FIG. 3, the voltage controller 212 comprises the current controller 2121 and the charge pump 2122. The current controller 2121 comprises three control ends $C_4$, $C_5$, and $C_6$, and two output ends $O_1$ and $O_2$. The charge pump 2122 comprises a control end C, a boot end EN, and an output end O.

The current controller 2121 receives the control signal $S_{UP}$ and $S_{DN}$, and the turn-off signal $S_{CKE}$ to output the current controlling signal $S_I$ and the boot signal $S_{EN}$ accordingly, for controlling the charge pump 2122.

In the first embodiment of the current controller 2121 of the present invention, when the turn-off signal $S_{CKE}$ is not received, the current controller 2121 continues to transmit the boot signal $S_{EN}$ to the charge pump 2122, and transmit the current controlling signal $S_I$ to the charge pump according to the control signals $S_{UP}$ and $S_{DN}$. Hence, under the state of continuous on, the charge pump 2122 charges or discharges the capacitor $C_X$ according to the current controlling signal $S_I$. When the turn-off signal $S_{CKE}$ is received, the current controller 2121 stops transmitting the boot signal $S_{EN}$ to the charge pump 2122, causing the charge pump 2122 to be turned off. Hence, the power consumption of the charge pump 2122 is saved.

In the second embodiment of the current controller 2121 of the present invention, when the turn-off signal $S_{CKE}$ is not received, the current controller 2121 continues to transmit the boot signal $S_{EN}$ to the charge pump 2122, and transmit the current controlling signal $S_I$ to the charge pump 2122 according to the control signals $S_{UP}$ and $S_{DN}$. Hence, under the state of continuous on, the charge pump 2122 charges or discharges the capacitor $C_X$ according to the current controlling signal $S_I$. When the turn-off signal $S_{CKE}$ is received, the current controller 2121 determines whether to transmit the boot signal $S_{EN}$ to the charge pump 2122 according to the phase difference between the clock signal CLK and the delayed clock signal $CLK_D$. More particularly, after the turn-off signal $S_{CKE}$ is received, when the phase difference between the clock signal CLK and the delayed clock signal $CLK_D$ is larger than the first predetermined value $D_{PT}$, the current controller 2121 still transmits the boot signal $S_{EN}$ to the charge pump 2122, causing the charge pump 2122 to charge or discharge the capacitor $C_X$ so the phase difference between the clock signal CLK and the delayed clock signal $CLK_D$ does not continue to increase and cause excessive time for future phase locking. Also, after the turn-off signal $S_{CKE}$ is received, when the phase difference between the clock signal CLK and the delayed clock signal $CLK_D$ is smaller than the second predetermined value $D_{PB}$, the current controller 2121 stops transmitting the boot signal $S_{EN}$ to the charge pump 2122 and the charge pump 2122 is turned off. Hence, the second embodiment of the current controller 2121 of the present invention can still save the power consumption of the charge pump 2122, and resulting in less time is needed for phasing locking after reboot. In addition, the first predetermined value $D_{PT}$ can be larger than the second predetermined value $D_{PB}$.

Figure 4:
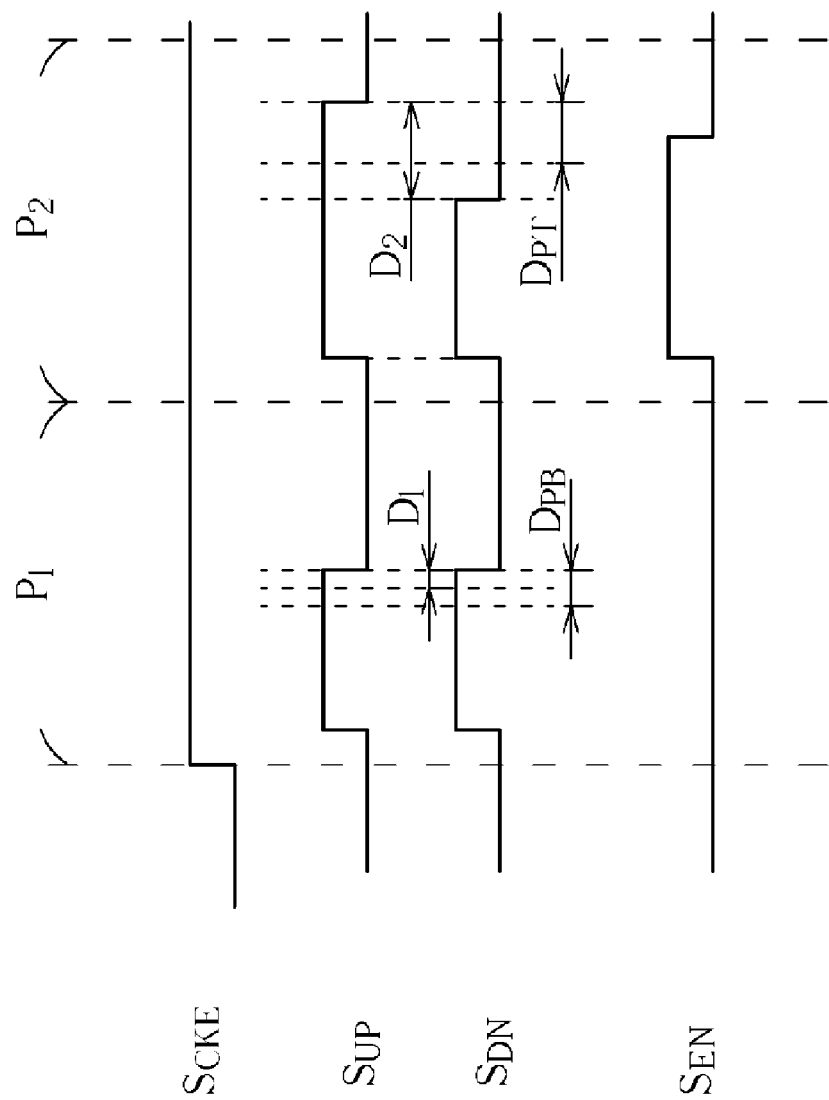
FIG. 4 is a timing diagram illustrating the second embodiment of the current controller of the present invention.

Please refer to FIG. 4. FIG. 4 is a timing diagram illustrating the second embodiment of the current controller 2121 of the present invention. The current controller 2121, according to the signal period between the controlling signals $S_{UP}$ and $S_{DN}$, determines the phase difference between the clock signal CLK and the delayed clock signal $CLK_D$. As shown in FIG. 4, in the stage $P_1$, the signal period difference of the turn-on state between the control signals $S_{UP}$ and $S_{DN}$ is $D_1$ and the signal period difference $D_1$ is smaller than the predetermined value $D_{PB}$, causing the current controller 2121 to stop transmitting the boot signal $S_{EN}$ and the charge pump 2122 is turned off. In the stage $P_2$, the signal period difference of the turn-on state between the control signals $S_{UP}$ and $S_{DN}$ is $D_2$ and the signal period difference $D_2$ is larger than the predetermined value $D_{PT}$, causing the current controller 2121 to start transmitting the boot signal $S_{EN}$ to boot-up the charge pump 2122.

To sum up, the DLL 210 of the present invention can effectively utilize the turn-off signal $S_{CKE}$ to save the power consumption of the DLL 210, providing more convenience to the user.

Those skilled in the art will readily observe that numerous modifications and alterations of the device and method may be made while retaining the teachings of the invention.

What is claimed is:

1. A DLL with power-saving function, the DLL comprising:
   a VCDL, comprising:
      a first input end for receiving a first clock signal;
      a second input end for receiving a controlling voltage; and
      an output end for outputting a second clock signal by delaying the first clock signal, according to the controlling voltage; and
   a voltage controlling module coupled to the second input end of the VCDL, the voltage controlling module comprising:
      a capacitor coupled between the second input end of the VCDL and a ground end, for sustaining the controlling voltage;
      a phase detector for generating a first controlling signal and a second controlling signal, according to phase difference between the first clock signal and the second clock signal; and
      a voltage controller, comprising:
         a current controller, comprising:
            a first controlling end, for receiving the first controlling signal;
            a second controlling end, for receiving the second controlling signal;
            a third controlling end, for receiving a turn-off signal;
            a first output end for outputting a current controlling signal according to the first controlling signal and the second controlling signal; and
            a second output end for outputting a boot signal;
         wherein when the current controller receives the turn-off signal, the current controller outputs the boot signal when a period difference between the first controlling signal and the second controlling signal is larger than a predetermined value to enable the charge pump; and the current controller stops outputting the boot signal when the period difference between the first controlling signal and the second controlling signal is smaller than the predetermined value to disable the charge pump;
      a charge pump, comprising:
         a first controlling end coupled to the first output end of the current controller, for receiving the current controlling signal;
         a second controlling end coupled to the second output end of the current controller for receiving the boot signal; and
         an output end coupled to the capacitor;
         wherein when the charge pump receives the boot signal, the charge pump sources or sinks a current with a predetermined magnitude, according to the current controlling signal.

2. The DLL of claim 1, wherein the phase detector comprising:
   a first input end for receiving the first clock signal;
   a second input end for receiving the second clock signal;
   a first output end for outputting the first controlling signal from the output end of the phase detector, when phase of the first clock signal is ahead phase of the second clock signal; and
   a second output end for outputting the second controlling signal from the output end of the phase detector, when phase of the first clock signal is behind phase of the second clock signal.

3. The DLL of claim 2, wherein when the current controller receives the first controlling signal and does not receive the turn-off signal, the current controller transmits the current controlling signal and the boot signal to the charge pump for sourcing the current with the predetermined magnitude.

4. The DLL of claim 2, wherein when the current controller receives the second controlling signal and does not receive the turn-off signal, the current controller transmits the current controlling signal and the boot signal to the charge pump for sinking the current with the predetermined magnitude.

5. A power-saving method for a Delay Lock Loop (DLL), the DLL comprising a Voltage-Controlled Delay Loop (VCDL) and a voltage controlling module, a phase detector, a current controller and a charge pump, the VCDL receiving a first clock signal and a controlling voltage, the power-saving method comprises:
   the VCDL outputting a second clock signal according to the first clock signal and the controlling voltage;
   the phase detector outputting a first controlling signal and a second controlling signal by comparing a phase difference between the first clock signal and the second clock signal;
   the current controller outputting a current controlling signal according to the first controlling signal and the second controlling signal;
   the current controller outputting a boot signal for enabling the charge pump;
   the charge pump sourcing or sinking a current with a predetermined magnitude to adjust the controlling voltage according to the current controlling signal; and when receiving a turn-off signal, the current controller outputting the boot signal to the charge pump according to a phase difference between the first clock signal and the second clock signal;

wherein when the phase difference between the first clock signal and the second clock signal is larger than a first predetermined value, the current controller outputting the boot signal to the charge pump to enable the charge pump;

wherein when the phase difference between the first clock signal and the second clock signal is smaller than a second predetermined value, the current controller stops outputting the boot signal to the charge pump, for disabling the charge pump;

wherein the first predetermined value is larger than the second predetermined value.

6. The method of claim 5, wherein the phase detector outputting the first controlling signal and the second controlling signal by comparing the phase difference between the first clock signal and the second clock signal is the phase detector outputting the first controlling signal when phase of the first clock signal is ahead phase of the second clock signal.

7. The method of claim 5, wherein the phase detector outputting the first controlling signal and the second controlling signal by comparing the phase difference between the first clock signal and the second clock signal is the phase detector outputting the second controlling signal when phase of the first clock signal is behind phase of the second clock signal.

8. The method of claim 5, wherein the charge pump sourcing or sinking a current with a predetermined magnitude to adjust the controlling voltage according to the current controlling signal is when the current controller receives the first controlling signal and does not receive the turn-off signal, the current controller transmits the current controlling signal and the boot signal to the charge pump for sourcing the current with the predetermined magnitude.

9. The method of claim 5, wherein the charge pump sourcing or sinking a current with a predetermined magnitude to adjust the controlling voltage according to the current controlling signal is when the current controller receives the second controlling signal and does not receive the turn-off signal, the current controller transmits the current controlling signal and the boot signal to the charge pump for sinking the current with the predetermined magnitude.

10. A Dynamic Random Access Memory (DRAM) system, comprising:
a DLL, comprising:
a VCDL, comprising:
a first input end for receiving a first clock signal;
a second input end for receiving a controlling voltage; and
an output end for outputting a second clock signal by delaying the first clock signal, according to the controlling voltage; and
a voltage controlling module coupled to the second input end of the VCDL, the voltage controlling module comprising:
a capacitor coupled between the second input end of the VCDL and a ground end, for sustaining the controlling voltage;
a phase detector for generating a first controlling signal and a second controlling signal, according to phase difference between the first clock signal and the second clock signal; and
a voltage controller, comprising:
a current controller, comprising:
a first controlling end, for receiving the first controlling signal;
a second controlling end, for receiving the second controlling signal;
a third controlling end, for receiving a turn-off signal; and
a first output end for outputting a current controlling signal according to the first controlling signal and the second controlling signal; and
a second output end for outputting a boot signal;
wherein when the current controller receives the turn-off signal, the current controller outputs the boot signal when a period difference between the first controlling signal and the second controlling signal is larger than a predetermined value to enable the charge pump; and the current controller stops outputting the boot signal when the period difference between the first controlling signal and the second controlling signal is smaller than the predetermined value to disable the charge pump;
a charge pump, comprising:
a first controlling end coupled to the first output end of the current controller, for receiving the current controlling signal;
a second controlling end coupled to the second output end of the current controller for receiving the boot signal; and
an output end coupled to the capacitor;
wherein when the charge pump receives the boot signal, the charge pump sources or sinks a current to the capacitor with a predetermined magnitude, according to the current controlling signal; and
a DRAM, comprising:
a first input end, for receiving the second clock signal; and
a second input end, for receiving the turn-off signal;
wherein when the DRAM does not receive the turn-off signal, the DRAM accesses data according to the second clock signal, and when the DRAM receives the turn-off signal, the DRAM stops receiving the second clock signal for stopping accessing data.

* * * * *